(12) United States Patent
Ok (10) Patent No.: US 7,886,796 B2
(45) Date of Patent: Feb. 15, 2011

(54) CHIP BONDING TOOL AND RELATED APPARATUS AND METHOD

(75) Inventor: Ji-Tae Ok, Seongnam-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 842 days.

(21) Appl. No.: 11/807,794

(22) Filed: May 30, 2007

(65) Prior Publication Data

US 2008/0202677 A1 Aug. 28, 2008

(30) Foreign Application Priority Data

Feb. 28, 2007 (KR) .................... 10-2007-0020479

(51) Int. Cl.
*H01L 21/02* (2006.01)
*H01L 21/67* (2006.01)
*B23K 26/20* (2006.01)

(52) U.S. Cl. .................. 156/379.8; 156/379.6; 156/580

(58) Field of Classification Search ............... 156/272.2, 156/272.8, 379.6, 379.8, 580, 362, 538; 257/778; 228/179.1, 180.1, 180.21, 180.22

See application file for complete search history.

(56) References Cited

U.S. PATENT DOCUMENTS

| RE28,798 E * | 5/1976 | Herring et al. .............. 228/106 |
| 4,923,552 A * | 5/1990 | Fukushima et al. ...... 156/273.7 |
| 2002/0066767 A1* | 6/2002 | Takahashi et al. ........ 228/110.1 |
| 2006/0191631 A1* | 8/2006 | Kojima et al. ............ 156/272.8 |

FOREIGN PATENT DOCUMENTS

| JP | 2000-134053 A | 5/2000 |
| KR | 10-2005-0123395 A | 12/2005 |

* cited by examiner

*Primary Examiner*—Richard Crispino
*Assistant Examiner*—Daniel McNally
(74) *Attorney, Agent, or Firm*—Drinker Biddle & Reath LLP (57) ABSTRACT

A chip bonding tool, related apparatus and a method thereof. The chip bonding tool includes a pressing block, through which a laser beam passes, for pressing a semiconductor chip; and a projection disposed under the pressing block, through which the laser beam passes, onto which the semiconductor chip is sucked, which spaces the pressing block from the semiconductor chip.

15 Claims, 8 Drawing Sheets

CHIP BONDING TOOL AND RELATED APPARATUS AND METHOD

CROSS-REFERENCE TO RELATED APPLICATION

This application claims the benefit of Korean Patent Application No. 2007-0020479, filed Feb. 28, 2007, the disclosure of which is hereby incorporated herein by reference in its entirety.

BACKGROUND OF THE INVENTION

1. Field of the Invention

The present invention relates to chip bonding, and more particularly, to a chip bonding tool, a chip bonding apparatus having the same, and a method thereof, capable of preventing contamination of the chip bonding tool due to an adhesive agent during a chip bonding process for adhering a semiconductor chip to a substrate using a laser beam.

2. Description of the Related Art

Generally, a semiconductor package is assembled by various mounting methods. In recent times, with miniaturization and high integration of products, high performance of semiconductor chips is required, and thus the number of pins should be increased. This requires further improvement of reducing the distance between pins (i.e., a pad pitch). A flip chip bonding technology has been developed in order to meet this requirement.

In this flip chip bonding technology, as an adhesive resin for adhering a semiconductor chip to a substrate and preventing intrusion of foreign substances, an anisotropic conductive film (ACF), an anisotropic conductive adhesive (ACA), a non-conductive polymer (NCP), or the like is widely used.

As described above, when two media are bonded to each other using ACF, ACA, or NCP, a method of thermally bonding the media by pressing the media with a constant temperature, pressure and time is used, in consideration of characteristics of the bonding media.

A method of heating the media with a constant temperature may include using a hot bar with a heater (a hot-press method), using friction heat of contact parts using ultrasonic waves (an ultrasonic method), using a laser (a laser method), or the like.

The laser method uses a laser beam as a heat source; the beam passes through a transparent window while constant pressure is applied to the semiconductor chip and substrate.

Korean Laid-open Patent No. 2005-0123395 discloses a flip chip bonding apparatus using a laser beam, which will be described below in brief.

Figure 1:
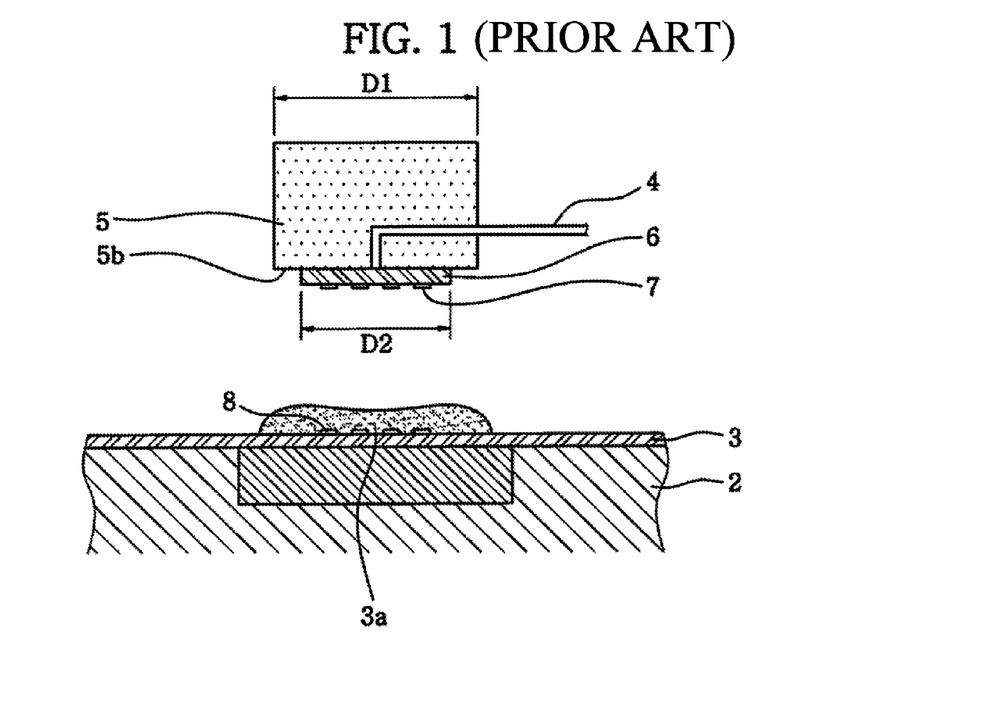
FIG. 1 is a cross-sectional view of a conventional flip chip bonding apparatus using a laser beam.
Figure 2:
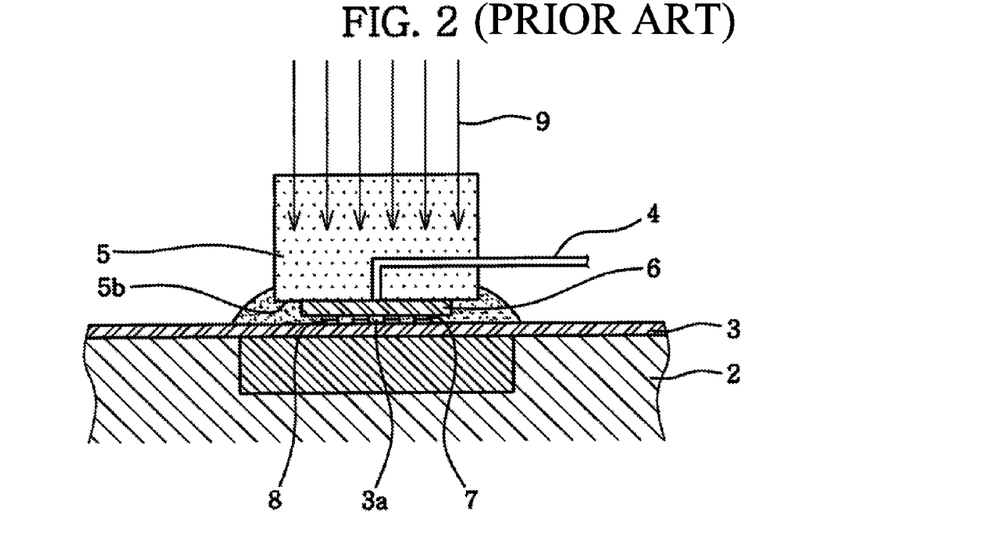
FIG. 2 is a cross-sectional view of the conventional flip chip bonding apparatus using a laser beam, illustrating contamination of the suction block.

Referring to FIGS. 1 and 2, a substrate 3 applied with an adhesive agent 3a is disposed on a stage 2, and a semiconductor chip 6 is sucked to a lower surface of a suction block 5 by a semiconductor chip suction part 4.

In this state, the suction block 5, which sucks the semiconductor chip 6, is moved downward such that a connection terminal 7 of the semiconductor chip 6 is in contact with a connection terminal 8 of the substrate 3. As a result, the semiconductor chip 6 is pressed downward and a laser beam 9 transmits through the suction block 5 formed of a transparent material.

At this time, the adhesive agent 3a applied to the substrate 3 is spread around the semiconductor chip 6 by heat of the laser beam 9 and then cured.

However, in the conventional flip chip bonding apparatus using a laser beam, the adhesive agent 3a may not be partially spread around the semiconductor chip 6 during the flip chip bonding process and then instantly cured so that the cured part can project higher than the semiconductor chip 6.

Such a problem may be caused by incorrect adjustment of the ACF, ACP or NCP, and may result in contamination of the chip bonding tool by the adhesive agent.

Such contamination may cause serious damage to the semiconductor chip or the press structure as the bonding process is performed and the adhesive agent is cured. In particular, in the case of the flip chip bonding apparatus using a laser beam, since the suction block is formed of a transparent material for transmitting a laser beam, it is impossible to continuously perform the bonding process when the contamination is generated. Such a phenomenon is likely to be generated when a width D1 of the suction block is greater than a diameter D2 of the semiconductor chip.

That is, in the case of the conventional flip chip bonding apparatus using a laser beam, the width D1 of the suction block is greater than the diameter D2 of the semiconductor chip, and the suction block is formed of a transparent material in order to uniformly radiate the laser beam 9 onto the entire surface of the semiconductor chip 6.

However, when the width D1 of the suction block is greater than the diameter D2 of the semiconductor chip, the adhesive agent 3a may contaminate the suction block 5 during the flip chip bonding process. As described above, when the suction block 5 is contaminated, transmissivity of the laser beam 9 may abruptly decrease, thereby causing delay or disruption of the flip chip bonding process.

SUMMARY OF THE INVENTION

An embodiment of the invention provides a chip bonding tool, a chip bonding apparatus having the same, and a method thereof, capable of effectively preventing contamination of the pressing block during the chip bonding process.

In one aspect, the invention is directed to a chip bonding tool including: a pressing block, through which a laser beam passes, for pressing a semiconductor chip; and a projection disposed under the pressing block, through which the laser beam passes, onto which the semiconductor chip is sucked, and spacing the pressing block from the semiconductor chip.

The pressing block may have a width greater than that of the semiconductor chip, and the projection may have a width smaller than that of the semiconductor chip, such that a lower surface of the projection in contact with the semiconductor chip is disposed within the upper surface of the semiconductor chip.

The projection may be separately formed from the pressing block, or integrally formed with the pressing block.

In addition, a plurality of projections may be formed at predetermined intervals.

In another aspect, the invention is directed to a chip bonding apparatus including: a stage for supporting a substrate; a pressing block, through which a laser beam passes, for pressing a semiconductor chip; and a projection disposed under the pressing block, through which the laser beam passes, onto which the semiconductor chip is sucked, and spacing the pressing block from the semiconductor chip.

The pressing block and the projection may have a vacuum hole for sucking the semiconductor chip.

In still another aspect, the invention is directed to a chip bonding method including: applying an adhesive agent to a substrate, and sucking a semiconductor chip to a lower surface of a projection using a suction module such that a pressing block is spaced apart from the semiconductor chip; moving the pressing block downward; aligning the semiconductor chip to the substrate; and radiating a laser beam to cure the adhesive agent applied to the substrate.

When the semiconductor chip is aligned to the substrate, after detecting positions of the semiconductor chip and the substrate using a vision camera to verify that the terminals of the semiconductor chip are in contact with the terminals of the substrate, and the semiconductor chip may be pressed downward.

BRIEF DESCRIPTION OF THE DRAWINGS

The foregoing and other objects, features and advantages of the invention will become more apparent from the following detailed description of exemplary embodiments of the invention and the accompanying drawings. The drawings are not necessarily to scale, emphasis instead being placed upon illustrating the principles of the invention.

DETAILED DESCRIPTION OF THE INVENTION

The present invention will now be described more fully hereinafter with reference to the accompanying drawings, in which exemplary embodiments of the invention are shown.

Figure 3:
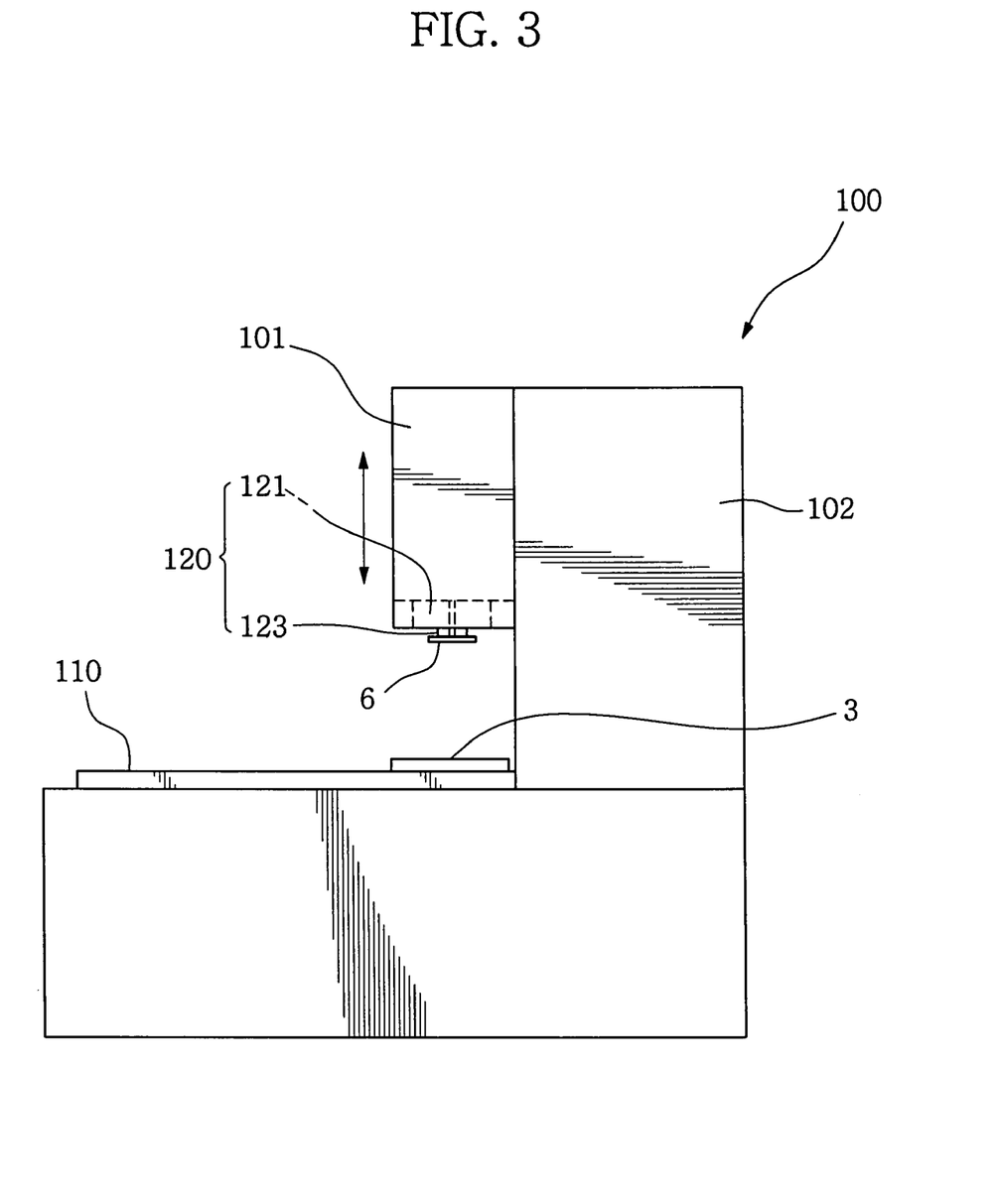
FIG. 3 is a side view of a chip bonding apparatus in accordance with an exemplary embodiment of the present invention.
Figure 4:
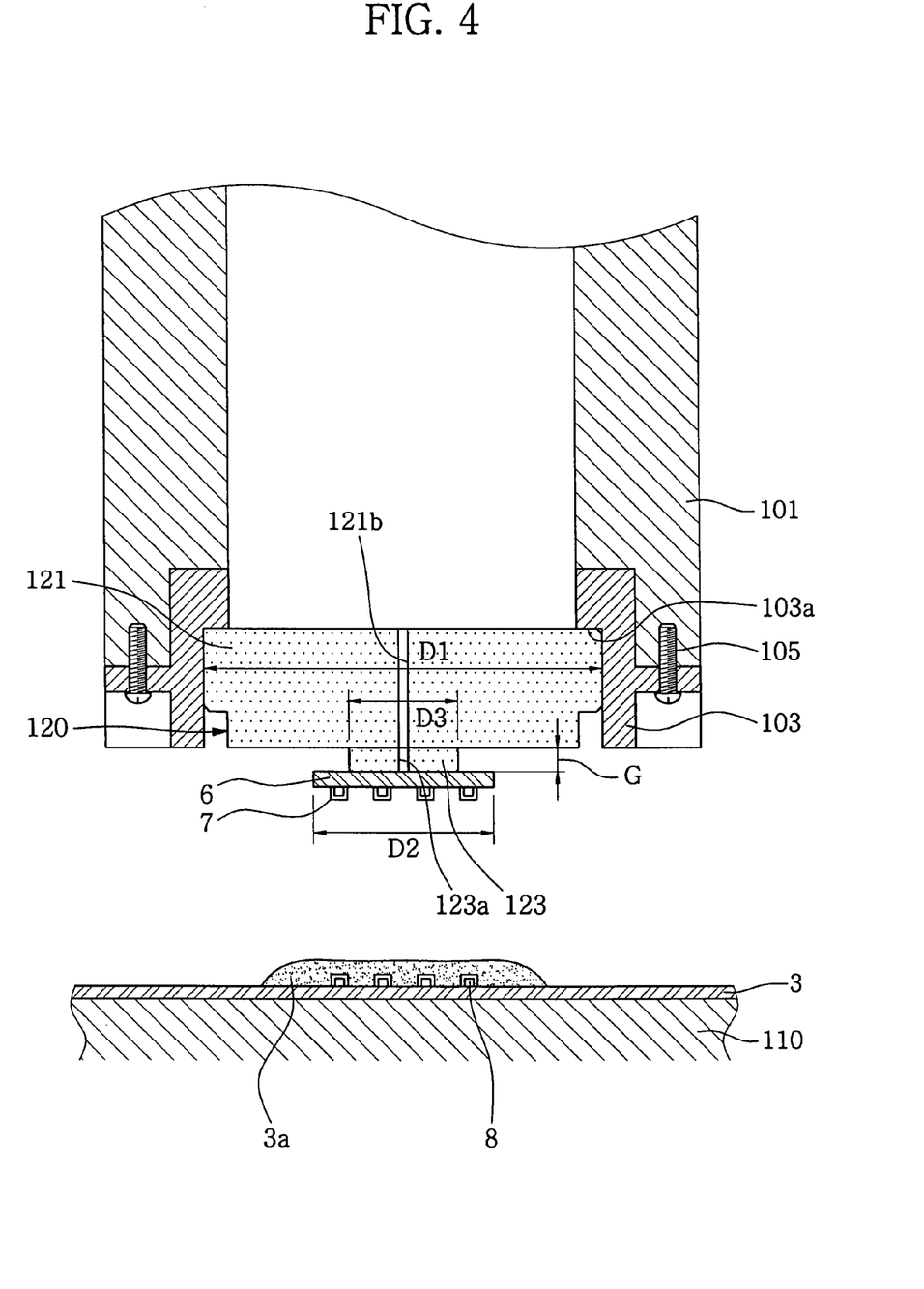
FIGS. 4 and 5 are cross-sectional views of the chip bonding apparatus of FIG. 3, illustrating a flip chip bonding process.
Figure 5:
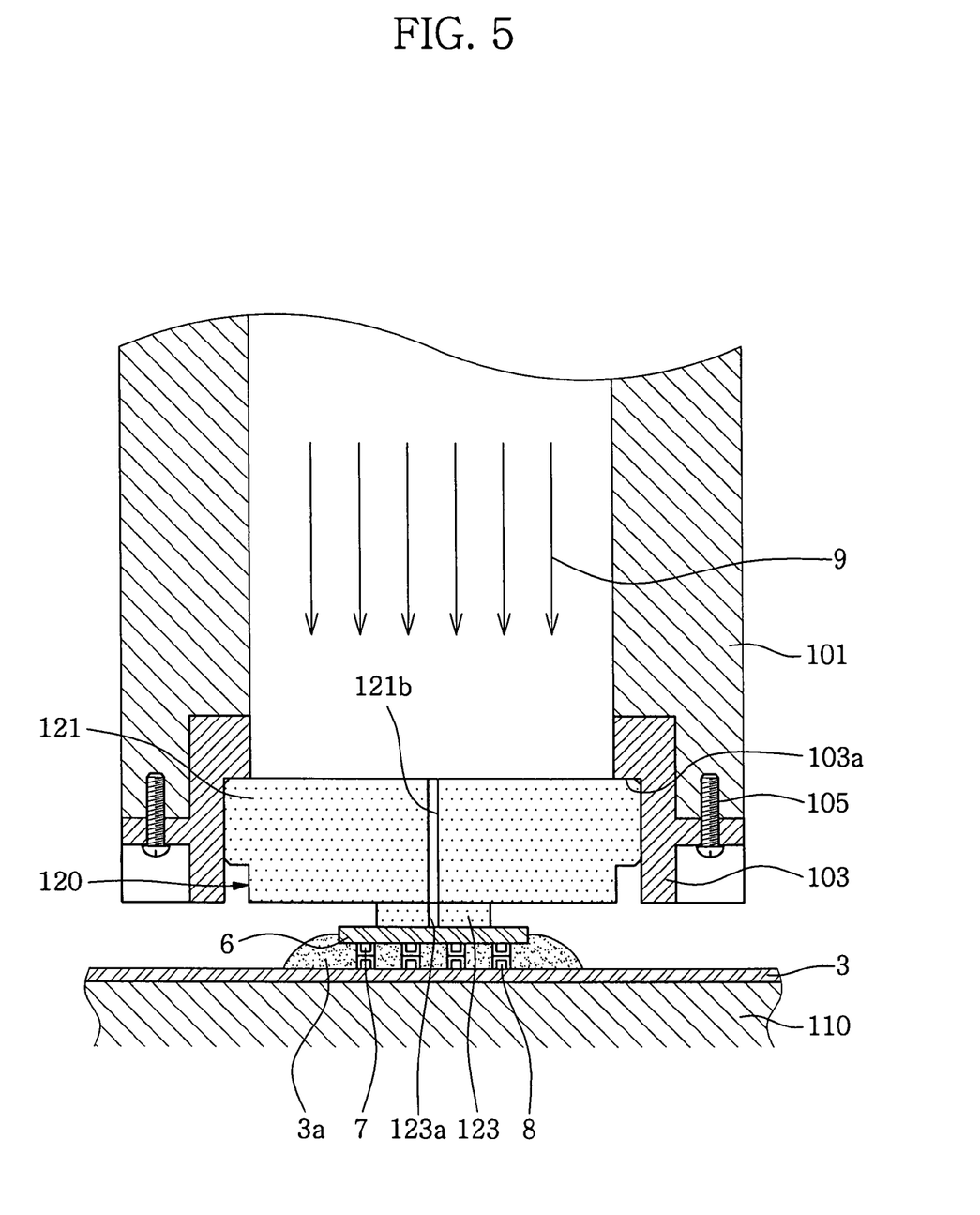
Figure 6:
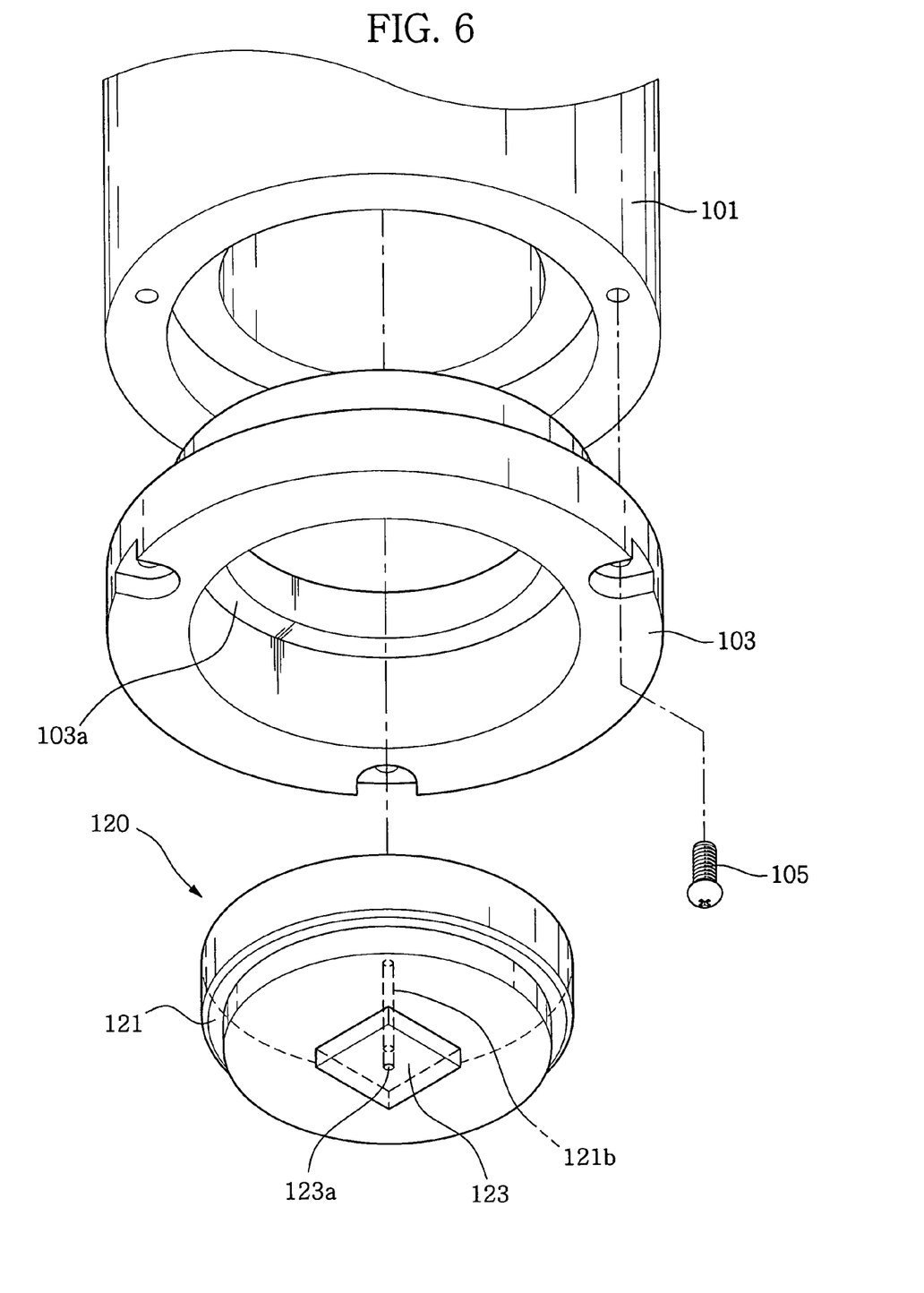
FIG. 6 is an exploded perspective view of a chip bonding tool in accordance with an exemplary embodiment of the present invention.

FIG. 3 is a side view of a chip bonding apparatus in accordance with an exemplary embodiment of the present invention, FIGS. 4 and 5 are cross-sectional views of the chip bonding apparatus of FIG. 3, illustrating a flip chip bonding process, and FIG. 6 is an exploded perspective view of a chip bonding tool in accordance with an exemplary embodiment of the present invention.

Referring to FIG. 3, a chip bonding apparatus 100 in accordance with an exemplary embodiment of the present invention includes a stage 110 for supporting a substrate; and a chip bonding tool 120 having a pressing block 121 for pressing a semiconductor chip 6 and through which a laser beam passes, and a projection 123 through which a laser beam passes, onto which the semiconductor chip 6 is sucked, and disposed under the pressing block to space the pressing block 121 from the semiconductor chip 6.

An optical tube 101 is installed in the front of a main body 102 of the chip bonding apparatus 100 to guide a laser beam.

Turning now to FIGS. 4 and 5, the chip bonding tool 120 includes the pressing block 121 formed of a transparent material through which a laser beam 9 passes, and which presses the semiconductor chip 6, and the projection 123 disposed under the pressing block 121 to space the pressing block 121 from the semiconductor chip 6 by a predetermined gap G during a chip bonding process.

A vacuum hole 121$b$ for sucking the semiconductor chip 6 is formed at a center of the pressing block 121. A laser beam 9 radiated from a laser beam generating apparatus (not shown) installed over the optical tube 101 is transmitted through the transparent pressing block 121. A suction module (not shown) for sucking the air is connected to the vacuum hole 121$b$.

A vacuum hole 123$a$ is formed at the projection 123 to be connected to the vacuum hole 121$b$ of the pressing block 121. The air is sucked through the vacuum holes 121$b$ and 123$a$ by operating the suction module so that the semiconductor chip 6 is sucked onto a lower surface of the projection 123.

The pressing block 121 has a width D1 greater than or equal to a width D2 of the semiconductor chip 6, and the projection 123 has a width D3 smaller than the width D2 of the semiconductor chip 6.

The reason the pressing block 121 has a width D1 greater than or equal to the width D2 of the semiconductor chip 6 is so the laser beam 9 can radiate all the way to the edges as well as the center of the semiconductor chip 6 in order to rapidly cure an adhesive agent 3$a$.

The adhesive agent used in the chip bonding apparatus in accordance with an exemplary embodiment of the present invention may include a non-conductive polymer (NCP), an anisotropic conductive adhesive (ACA), an anisotropic conductive film (ACF), and so on. These adhesive agents function to adhere the semiconductor chip to the substrate and prevent intrusion of foreign substances.

The projection 123 may be formed separately from the pressing block 121, and then adhered to a lower surface of the pressing block 121.

The reason for separately forming the projection 123 from the pressing block 121 is to increase process convenience and reduce manufacturing cost.

Alternatively, the pressing block 121 and the projection 123 may be integral and formed of the same material.

The projection 123 is disposed at a lower surface of the pressing block 121 in a stepped manner. In this case, the projection 123 has a width D3 smaller than the width D1 so that the pressing block 121 is spaced apart from the semiconductor chip 6 by a predetermined gap G during the chip bonding process.

Specifically, when the width D3 of the projection 123 is greater than or equal to the width D1 of the pressing block 121, i.e., when a surface of the projection 123 in contact with the semiconductor chip 6 is not disposed within the upper surface of the semiconductor chip 6, the adhesive agent may contaminate the projection 123 during the chip bonding process. Therefore, it is preferred that the surface of the projection 123 in contact with the semiconductor chip 6 be disposed within the upper surface of the semiconductor chip 6.

As shown in FIG. 6, in order to facilitate exchanging the bonding tool 120, the pressing block 121 may be inserted into a clamping housing 103, and the clamping housing 103, into which the pressing block 121 is inserted, may be fastened to a lower part of the optical tube 101 by bolts 105.

In order to exchange the pressing block 121 with a new one, first, the bolts 105 are unfastened, the clamping housing 103 is separated therefrom, and then the bonding tool 120 is extracted from the clamping housing 103.

Next, after inserting a new bonding tool (not shown) into the clamping housing 103 in the same manner as described above, the clamping housing 103, into which the new bonding tool (not shown) is inserted, is fastened to the optical tube 101 using the bolts 105.

In addition, a threshold or step 103a is formed at an inner surface of the clamping housing 103 to be in contact with an upper edge surface of the pressing block 121.

The upper edge surface of the pressing block 121 is supported by the threshold or step 103a to securely fix the pressing block 121 in the clamping housing 103.

In the chip bonding apparatus 100 and the chip bonding tool 120 in accordance with an exemplary embodiment of the present invention, the adhesive agent 3a is applied onto the substrate 3 disposed on the stage 110.

At the same time, the suction module operates to suck the air through the vacuum holes 121b and 123a, thereby sucking the semiconductor chip 6 onto the lower surface of the projection 123.

At this time, the semiconductor chip 6 is spaced apart from the pressing block 121 by a predetermined gap G by the projection 123.

Here, since the process of applying the adhesive agent 3a to the substrate 3 is performed separately from the process of sucking the semiconductor chip 6 onto the lower surface of the projection 123, these processes may be performed at the same time or in a reversed order.

Then, the pressing block 121 moves the semiconductor chip 6 downward to align the semiconductor chip 6 to the substrate 3.

At this time, since the width D1 of the pressing block 121 is greater than the width D2 of the semiconductor chip, the laser beam 9 is uniformly radiated onto the edge as well as the center of the semiconductor chip 6.

In accordance with the invention, when the adhesive agent 3a is applied to the substrate 3 and is cured by heat of the laser beam 9, even in a situation where the adhesive agent 3a is partially disposed over the semiconductor chip 6 due to inappropriate adjustment of the ACF, ACP or NCP, contamination of the pressing block 121 is prevented.

In the flip chip bonding apparatus 100 and the bonding tool 120 in accordance with an exemplary embodiment of the present invention, the projection may be formed in various shapes in order to form the predetermined gap G.

Figure 7:
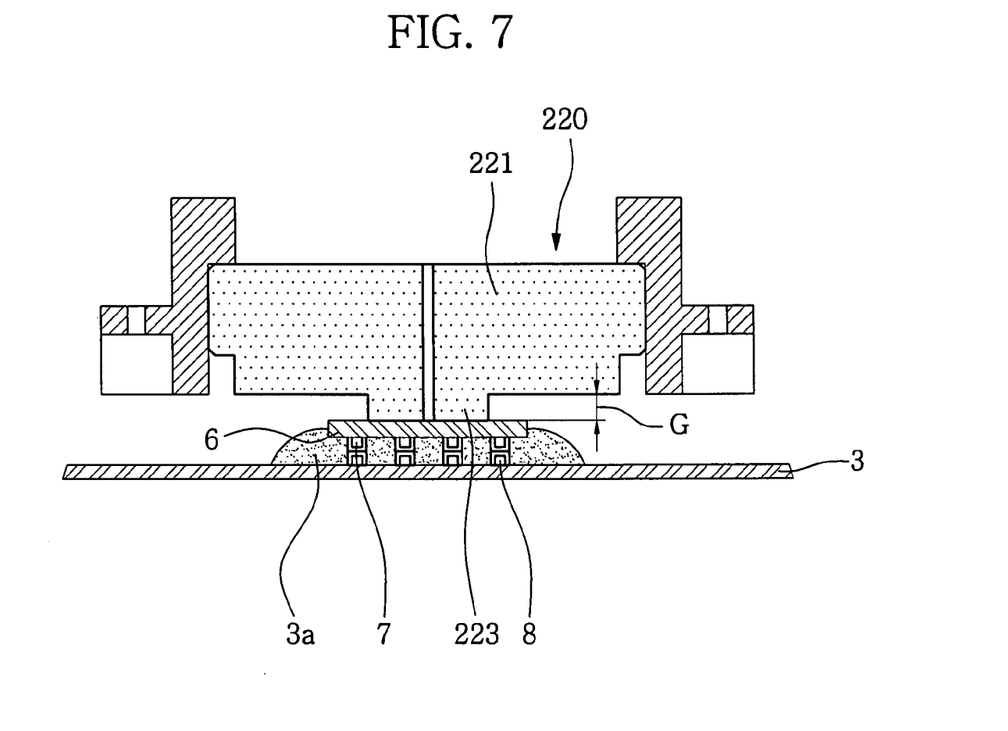
FIG. 7 is a cross-sectional view of a chip bonding tool in accordance with another exemplary embodiment of the present invention.

Turning now to FIG. 7, there is illustrated a bonding tool in accordance with another exemplary embodiment of the present invention.

The bonding tool 220 has a projection 230 integrally formed with a pressing block 221. A gap G is maintained between the semiconductor chip 6 and the pressing block 221 by the projection 223. In accordance with the invention, when an adhesive agent 3a is applied to a substrate 3 and is cured by heat of a laser beam 9, even in a situation where the adhesive agent 3a is partially disposed over the semiconductor chip 6, contamination of the pressing block 221 is prevented. In this case, it is somewhat disadvantageous in process convenience, but very advantageous in strength.

Figure 8:
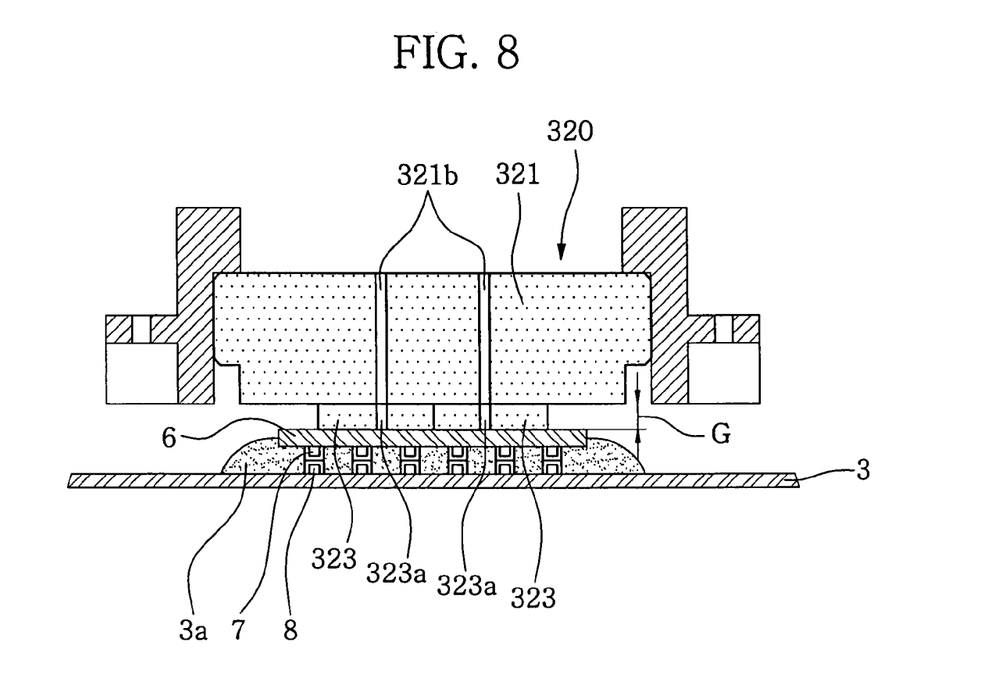
FIG. 8 is a cross-sectional view of a chip bonding tool in accordance with still another exemplary embodiment of the present invention.

Turning now to FIG. 8, there is illustrated another exemplary embodiment of the present invention. The bonding tool 320 includes a plurality of projections 323 disposed around the center of a pressing block 321 at predetermined intervals. The projections 323 may have vacuum holes 323a in communication with vacuum holes 321b of the pressing block 321, respectively. A gap G is maintained between a semiconductor chip 6 and the pressing block 321 by the projection 323.

In accordance with the invention, when an adhesive agent 3a is applied to a substrate 3 and is cured by heat of a laser beam 9, even in a situation where the adhesive agent 3a is partially disposed over the semiconductor chip 6, contamination of the pressing block 321 is prevented.

In this case, since the semiconductor chip 6 can be uniformly pressed downward, the semiconductor chip 6 can be more securely adhered to the substrate 3.

Figure 9:
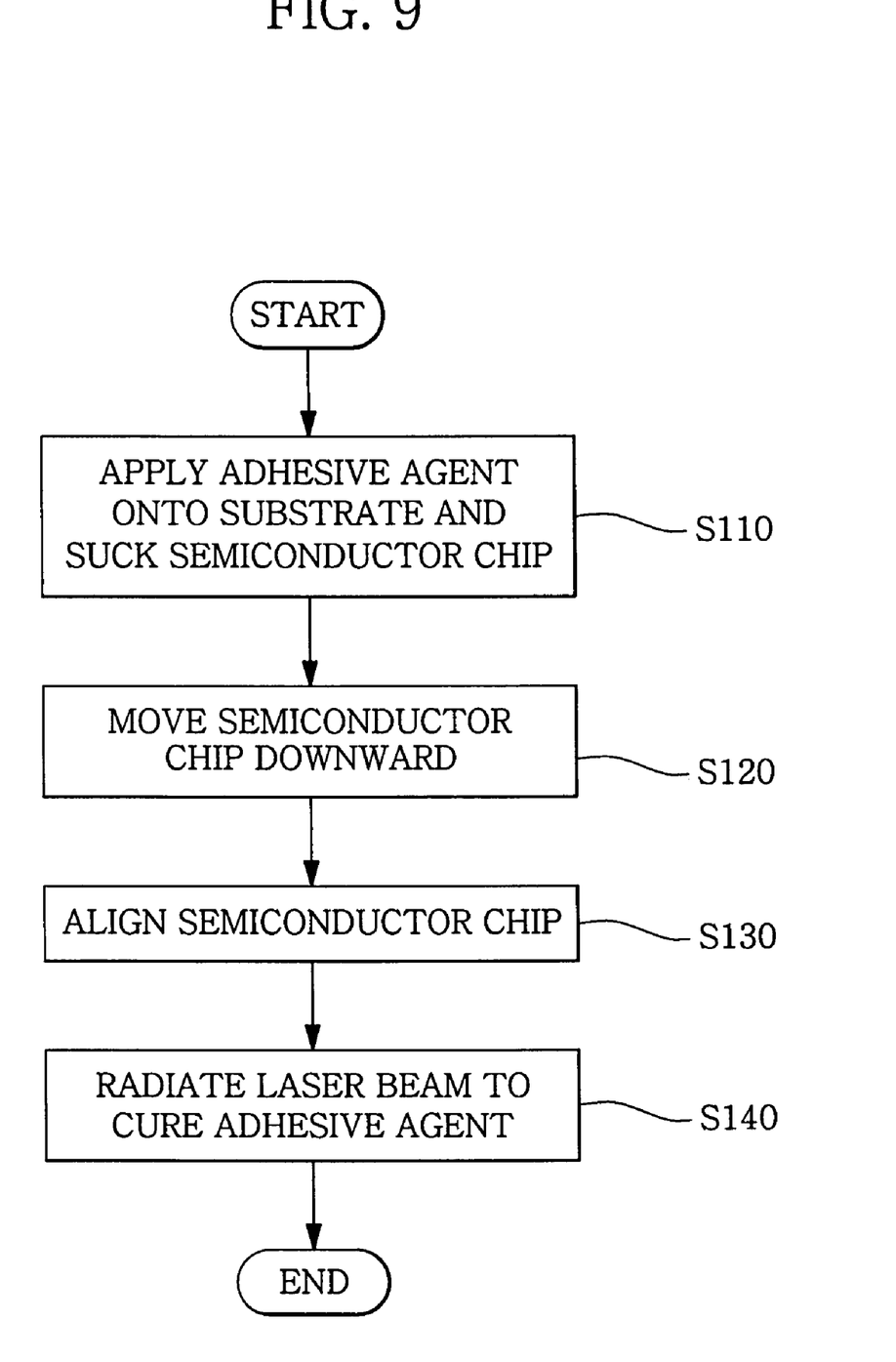
FIG. 9 is a flowchart illustrating a chip bonding process in accordance with an exemplary embodiment of the present invention.

FIG. 9 is a flowchart of a chip bonding process in accordance with an exemplary embodiment of the present invention. Hereinafter, a flip chip bonding method in accordance with an exemplary embodiment of the present invention will be described with reference to FIGS. 4, 5 and 9.

First, an adhesive agent 3a is applied to substrate 3, which is sequentially disposed on a stage 110, using an adhesive agent supply unit (not shown).

At the same time, when a chip conveyance robot (not shown) picks up one semiconductor chip 6 to move the semiconductor chip 6 under a pressing block, a suction module sucks the air through vacuum holes 121b and 123a formed in the pressing block 121 and a projection 123 to suck the semiconductor chip 6 onto a lower surface of the projection 123 (S110).

At this time, the semiconductor chip 6 is spaced apart from the pressing block 121 by a certain gap G by the projection 123 disposed on a lower surface of the pressing block 121.

Then, the pressing block 121 is moved downward (S120). Next, the semiconductor chip 6 is aligned to the substrate 3 (S130).

In this state, a laser beam 9 is radiated onto an upper surface of the semiconductor chip 6 so as not to contaminate the pressing block 121, thereby curing the adhesive agent 3a applied to the substrate 3 (S140). Since the projection 123 maintains a space between the pressing block 121 and the chip 6, contamination from the adhesive agent 3a is prevented.

When the semiconductor chip 6 is aligned to the substrate 3 (S130), a connection terminal 7 of the semiconductor chip 6 is in contact with a connection terminal 8 of the substrate 3, and the semiconductor chip 6 is pressed downward.

Figure 10:
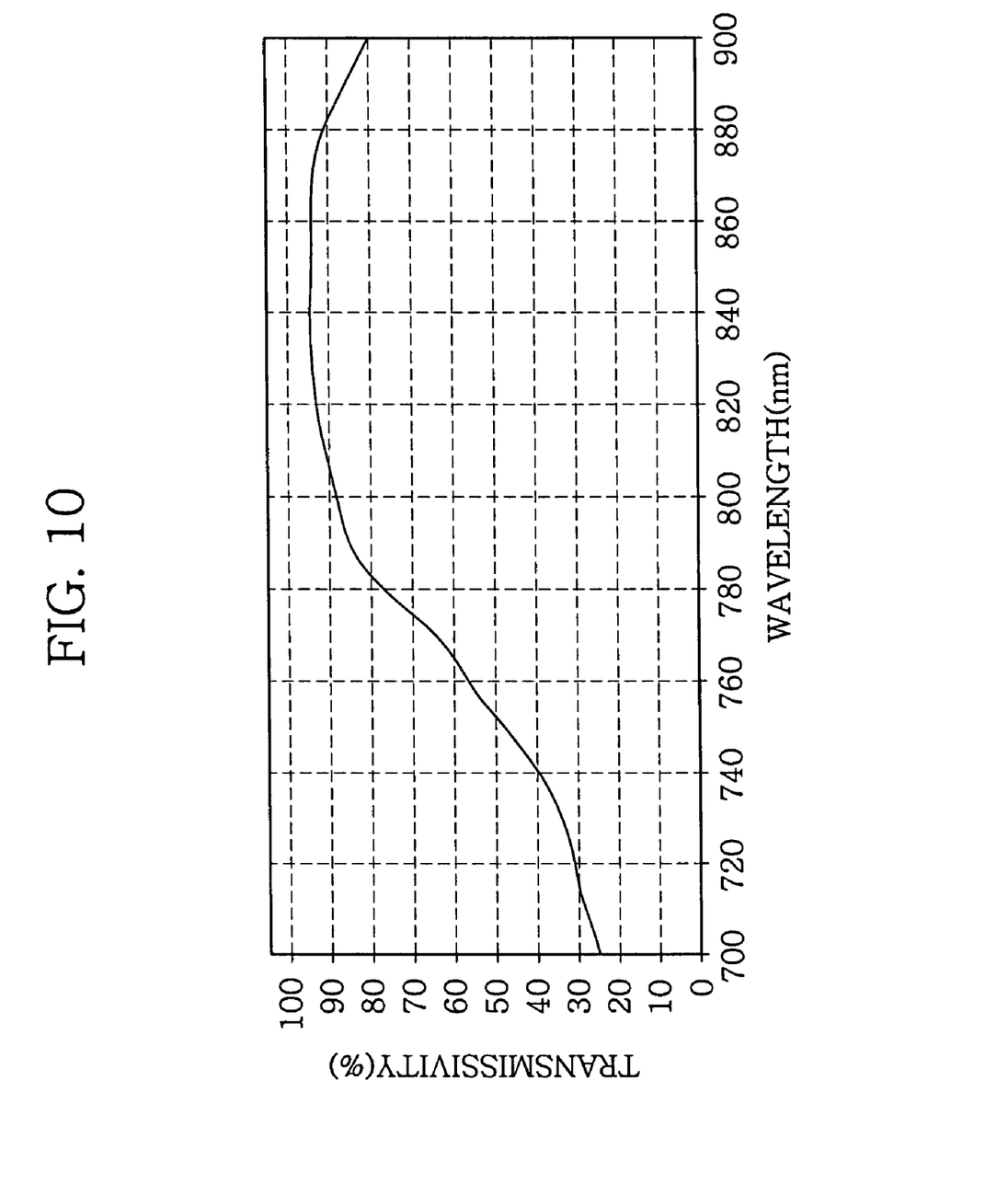
FIG. 10 is a graph of wavelength and transmissivity of a laser beam used in a chip bonding method in accordance with an exemplary embodiment of the present invention.

FIG. 10 is a graph of wavelength and transmissivity of a laser beam used in a flip chip bonding method in accordance with an exemplary embodiment of the present invention.

Referring to FIG. 10, in the flip chip bonding method in accordance with an exemplary embodiment of the present invention, a laser beam of 800-900 nm wavelength may be used, and at this time, transmissivity of the laser passing through the pressing block may be 80-100%.

In this case, it is possible to heat the semiconductor chip to an appropriate temperature, and it is possible to effectively prevent contamination of the pressing block by flowing the adhesive agent down around the semiconductor chip and simultaneously curing the adhesive agent.

For example, while the chip bonding apparatus in accordance with an exemplary embodiment of the present invention is described with reference to the flip chip bonding technology, it is possible to adapt the same to a die bonding technology for adhering a die onto a lead frame, a printed circuit board (PCB), a circuit tape, or the like.

Of course, a connection structure between the connection terminal of the semiconductor chip and the connection terminal of the substrate may be adapted to various connection structures such as a ball grid array (BGA), and the like.

As can be seen from the foregoing, since the projection maintains a gap between the semiconductor chip and the pressing block, contamination of the pressing block is avoided. In addition, it is possible to smoothly perform the chip bonding process and lengthen the lifespan of the pressing tool by effectively preventing contamination of the pressing block.

Exemplary embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A chip bonding tool comprising:
   a pressing block, through which a laser beam passes, for pressing a semiconductor chip; and
   a plurality of abutting projections formed at predetermined intervals disposed under the pressing block, through which the laser beam passes, onto which the semiconductor chip is sucked, which maintains a space between the pressing block and the semiconductor chip;
   wherein:
   the pressing block has a width greater than that of the semiconductor chip; and
   each of the plurality of projections has a width smaller than that of the semiconductor chip.

2. The chip bonding tool according to claim 1, wherein a lower surface of one or more of the projections in contact with the semiconductor chip is disposed within an upper surface of the semiconductor chip.

3. The chip bonding tool according to claim 1, wherein the pressing block and each of the projections are formed of a transparent material.

4. The chip bonding tool according to claim 1, wherein each of the projections are separately formed from the pressing block.

5. The chip bonding tool according to claim 1, wherein each of the projections are formed at a lower surface of the pressing block in a stepped manner.

6. The tool according to claim 1, wherein each of the plurality of projections comprises a single vacuum hole.

7. The tool according to claim 1, wherein the plurality of projections occupy a position away from an outer edge of the pressing block.

8. A chip bonding system comprising:
   a semiconductor chip having a predefined chip width;
   a chip bonding tool, as claimed in claim 1.

9. The system according to claim 8, further comprising:
   a laser generator for generating the laser beam that passes through the pressing block,
   wherein the pressing block has a block width that is greater than the chip width.

10. A chip bonding apparatus comprising:
    a stage for supporting a substrate;
    a pressing block, through which a laser beam passes, for pressing a semiconductor chip; and
    a plurality of abutting projections formed at predetermined intervals disposed under the pressing block, through which the laser beam passes, onto which the semiconductor chip is sucked, which maintains a space between the pressing block and the semiconductor chip;
    wherein:
    the pressing block has a width relatively greater than that of the semiconductor chip; and
    each of the plurality of projections has a width relatively smaller than that of the semiconductor chip.

11. The chip bonding apparatus according to claim 10, wherein the pressing block and at least one of the projections has a vacuum hole for sucking the semiconductor chip.

12. The chip bonding apparatus according to claim 10, wherein each of the projections are separately formed from the pressing block.

13. The chip bonding apparatus according to claim 10, wherein each of the projections are formed at a lower surface of the pressing block in a stepped manner.

14. The apparatus according to claim 10, wherein each of the plurality of projections comprises a single vacuum hole.

15. The apparatus according to claim 10, wherein the plurality of projections occupy a position away from an outer edge of the pressing block.

* * * * *